(12) United States Patent
Bruno et al.

(10) Patent No.: US 6,617,867 B2
(45) Date of Patent: Sep. 9, 2003

(54) MECHANISM FOR CLAMPING DEVICE INTERFACE BOARD TO PERIPHERAL

(75) Inventors: Christopher J Bruno, Attleboro, MA (US); Mark J. Estrella, Watertown, MA (US); Mark S. O'Brien, East Boston, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/966,874

(22) Filed: Sep. 28, 2001

(65) Prior Publication Data

US 2002/0063566 A1 May 30, 2002

Related U.S. Application Data

(60) Provisional application No. 60/253,916, filed on Nov. 29, 2000.

(51) Int. Cl.[7] ................................................ G01R 31/02
(52) U.S. Cl. ...................................... 324/758; 324/754
(58) Field of Search ................................ 324/538, 755, 324/756–765, 158.1, 754; 73/487, 866.5, 862.01; 439/775, 482, 803–824

(56) References Cited

U.S. PATENT DOCUMENTS 4,665,360 A * 5/1987 Phillips .................. 324/158 F
5,190,333 A * 3/1993 Minichan et al. ......... 294/86.41
5,617,866 A * 4/1997 Marian, Jr. .............. 128/662.3
5,982,182 A 11/1999 Chiu et al. .................. 324/754
6,104,202 A 8/2000 Slocum et al. .............. 324/758

FOREIGN PATENT DOCUMENTS

DE          1029900      5/1958
DE          8525949      10/1986      .......... H01R/31/02

* cited by examiner

Primary Examiner—Jay Patidar
Assistant Examiner—Amy He
(74) Attorney, Agent, or Firm—Bruce D. Rubenstein (57) ABSTRACT

A mechanism for attaching a device interface board (DIB) to a surface of a test head or peripheral includes first and second pulldown mechanisms attached to the surface and a substantially U-shaped actuator. Each of the pulldown mechanisms includes a rotating member coupled to a connecting member via a translation interface. The translation interface converts rotation of the rotating member into vertical movement of the connecting member. The U-shaped actuator has first and second ends respectively coupled to the rotating members of the first and second pulldown mechanisms. Swinging the U-shaped actuator through an arc rotates the rotating members and causes the connecting members to move vertically. A DIB that latches with the connecting members can thus be pulled down against the surface quickly and conveniently, with sufficient mechanical leverage for compressing large numbers of spring-loaded pins.

20 Claims, 6 Drawing Sheets

MECHANISM FOR CLAMPING DEVICE INTERFACE BOARD TO PERIPHERAL

CROSS-REFERENCES TO RELATED APPLICATIONS

This application claims priority to U.S. provisional patent application No. 60/253,916, filed Nov. 29, 2000.

STATEMENT REGARDING FEDERALLY SPONSORED RESEARCH OR DEVELOPMENT

Not Applicable.

Reference to Microfiche Appendix

Not Applicable

BACKGROUND OF THE INVENTION

1. Field of the Invention

This invention relates generally to automatic test equipment of the type that includes a tester that docks with a peripheral, such as a prober or handler, for testing integrated circuits. More particularly, this invention relates to devices and methods for attaching an interface board, such as a device interface board (DIB) to a peripheral or tester prior to docking.

2. Description of Related Art Including Information Disclosed Under 37 C.F.R. 1.97 and 1.98

Automatic test equipment (ATE) for testing integrated circuits includes two principle components—a tester and a peripheral. The tester includes electronic hardware and software for exercising devices under test ("DUTs"), to ensure that the devices work properly before they are shipped to customers. The peripheral includes mechanisms for automatically transferring DUTs to a test site, in rapid succession for testing by the tester, and for transferring the DUTs away from the test site once testing is complete. By operating together, the tester and the peripheral can test large numbers of devices very quickly.

At the interface between the tester and the peripheral lies a device interface board, or "DIB." The DIB generally includes a printed circuit board, a stiffener, and electrical contacts for conveying signals between the tester, the printed circuit board, and the peripheral. In a normal testing configuration, a DIB is attached to either the peripheral or a portion of the tester called the "test head." A manipulator then physically positions the test head in alignment with the peripheral and causes the test head and peripheral to mechanically "dock." The act of docking sandwiches the DIB between the test head and the peripheral and allows electrical signals to pass between the tester and DUTs for testing. The DIB electrically connects with the test head via a number of spring-loaded pins or push-on, blind mate connectors. The DIB electrically connects with the peripheral in different ways, depending on the type of peripheral.

Peripherals come in two basic types—"probers" and "handlers." Probers convey unpackaged semiconductor wafers to a test site for testing, whereas handlers convey packaged devices. Most probers require the use of a "probe tower," an array of double-sided, spring-loaded pins, for extending electrical signals from contacts on the DIB to contacts within the body of the prober. Signals pass in series from the tester, to the DIB, to the probe tower, and then into the body of the prober, where they are conveyed to test points of devices under test via probe needles. Handlers do not require probe towers. Instead, a "socket" is directly attached to the DIB for receiving devices under test.

Different techniques have evolved for attaching DIBs prior to docking when using probers and handlers. When using probers, operators customarily attach the DIB to the test head. This convention has evolved in part because tester manufacturers generally regard the DIB as part of the tester. The DIB may include special-purpose hardware for supporting various tests, and is often designed by the tester manufacturer. When using handlers, however, operators generally attach the DIB to the handler before docking. Because handlers do not require probe towers, there is no requirement that spring-loaded pins to be compressed when attaching a DIB to a handler. In addition, handlers generally impose exceedingly tight mechanical tolerances on the position of the socket with respect to the handler. These tolerances are more easily met by attaching the DIB to the handler, where alignment can be precisely controlled, than by attaching it to the test head, where alignment can only be established through the relatively coarse process of docking.

A prior technique for attaching a DIB to a test head before docking employs a round threaded ring having an internal shoulder that surrounds and engages the DIB. An operator places the ring around the DIB and screws the ring into a complementarily threaded region on the surface of the test head. Screwing down the ring draws the DIB against the surface of the test head and compresses spring loaded pins between them. Lever arms extending radially outward from the perimeter of the ring allow an operator to produce enough torque to compress the contacts between the test head and the DIB by turning the ring only a fraction of a revolution.

A prior technique for attaching a DIB to a handler before docking employs screws positioned around the perimeter of the DIB. An operator places the DIB against a receiving surface of the handler in careful alignment, and turns the screws to fasten the DIB in place.

Recent advancements in tester design have dramatically increased the number of signals that testers can provide. More pins can thus be provided between the tester and DIB, and between the DIB and the peripheral. More force is needed to compress the greater number of pins. In the Tiger test system available from Teradyne, Inc., of Boston, Mass., attaching a DIB to a fully loaded tester requires nearly 5000 Newtons of force, as compared with approximately half this amount for the previous generation of testers. This force is too great to be managed conveniently and practically by the threaded ring approach described above.

Moreover, we have recognized a need for greater consistency in the way that DIBs are attached when using probers and handlers. Two different techniques for attaching DIBs means that testing facilities that use both probers and handlers must maintain two different sets of hardware and train their personnel in executing two different procedures.

What is needed, therefore, is a technique for attaching a DIB substantially the same way for both probers and handlers, which is fast, convenient, and capable of applying significant forces for compressing large numbers of spring-loaded pins.

BRIEF SUMMARY OF THE INVENTION

With the foregoing background in mind, it is an object of the invention to enable a DIB to be attached prior to docking in substantially the same way for both probers and handlers.

It is another object of the invention to attach a DIB quickly and conveniently.

It is a further object of the invention to enable an operator to easily apply sufficient force to compress spring-loaded pins when attaching a DIB.

To achieve the foregoing objects, as well as other objectives and advantages, a to mechanism for attaching a DIB to a surface of a test head or peripheral includes first and second pulldown mechanisms attached to the surface and a substantially U-shaped actuator. Each of the first and second pulldown mechanisms includes a rotating member coupled to a connecting member via a translation interface or mechanism. The translation interface or mechanism converts rotation of the rotating member into vertical movement of the connecting member. The U-shaped actuator has first and second ends coupled to the rotating members of the first and second pulldown mechanisms. Swinging the U-shaped actuator through an arc rotates the rotating members of the first and second pulldown mechanisms, thereby causing the connecting members to move vertically.

In accordance with one embodiment of the invention, the DIB includes mating members for mating with the connecting members of the pulldown mechanisms. The mating members are disposed at locations of the DIB that allows them to engage the connecting members when the DIB is placed against the surface in a testing configuration. Once the mating members engage the connecting members, the U-shaped actuator can be swung through an arc to pull the DIB against the surface. Because the arc that the U-shaped actuator describes greatly exceeds the amount by which the DIB vertically moves, the mechanism imparts significant mechanical advantage for depressing large numbers of spring-loaded pins.

According to one variation, each mating member includes a spring-loaded latch for latching with the corresponding connecting member in response to the DIB being placed against the surface in the testing configuration. Once the DIB is latched to the surface, the DIB remains attached, even if an operator physically releases the DIB. The operator can then swing the U-shaped actuator to pull down the DIB, without having to simultaneously hold the DIB in place.

According to another variation, each mating member further includes a grasping member mechanically coupled to the spring-loaded latch and forming a handle for manually conveying the DIB to the peripheral. The handle can be rotated against a resisting force, for engaging the spring-loaded latch with the corresponding connecting member, or for disengaging the spring-loaded latch and thus freeing the interface board from the surface.

BRIEF DESCRIPTION OF THE SEVERAL VIEWS OF THE DRAWINGS

Additional objects, advantages, and novel features of the invention will become apparent from a consideration of the ensuing description and drawings, in which.

DETAILED DESCRIPTION OF THE INVENTION

Figure 1:
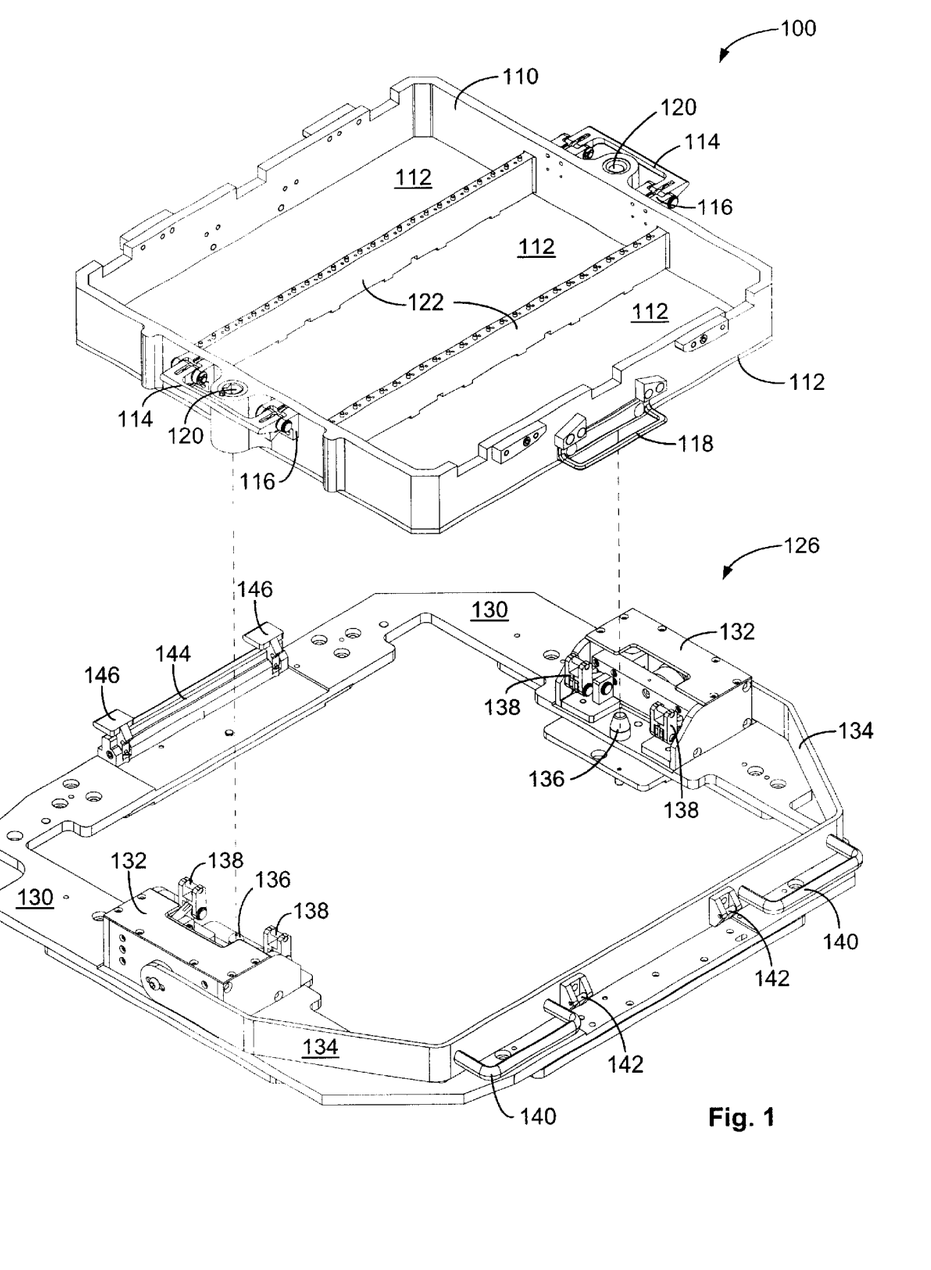
FIG. 1 is an isometric view showing a device interface board (DIB) and a receiving plate prior to attachment of the DIB to the receiving plate in accordance with the invention.
Figure 2:
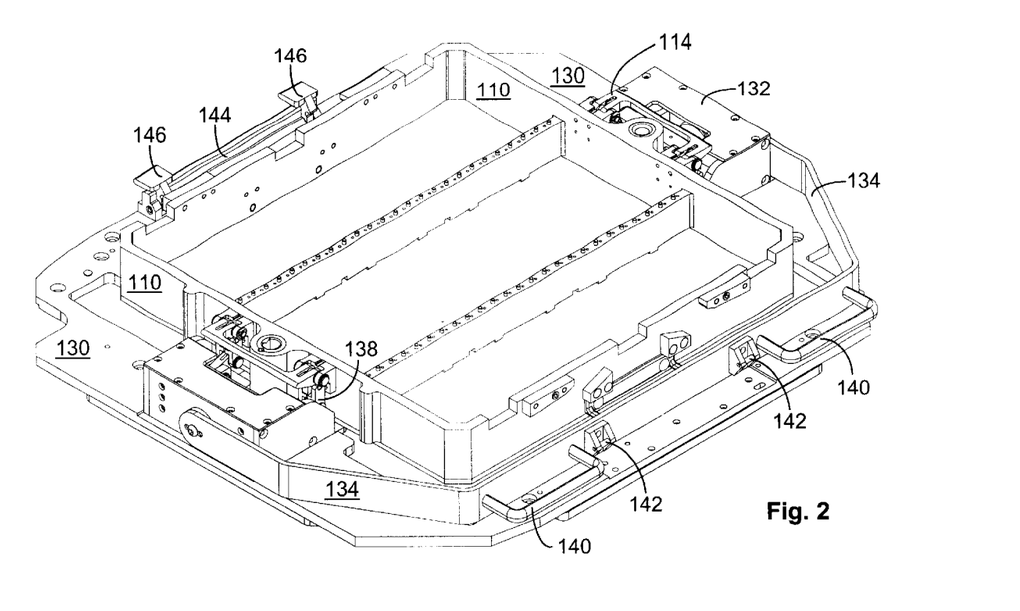
FIG. 2 is an isometric view showing the DIB of FIG. 1 latched to the receiving plate, but not pulled down.
Figure 3:
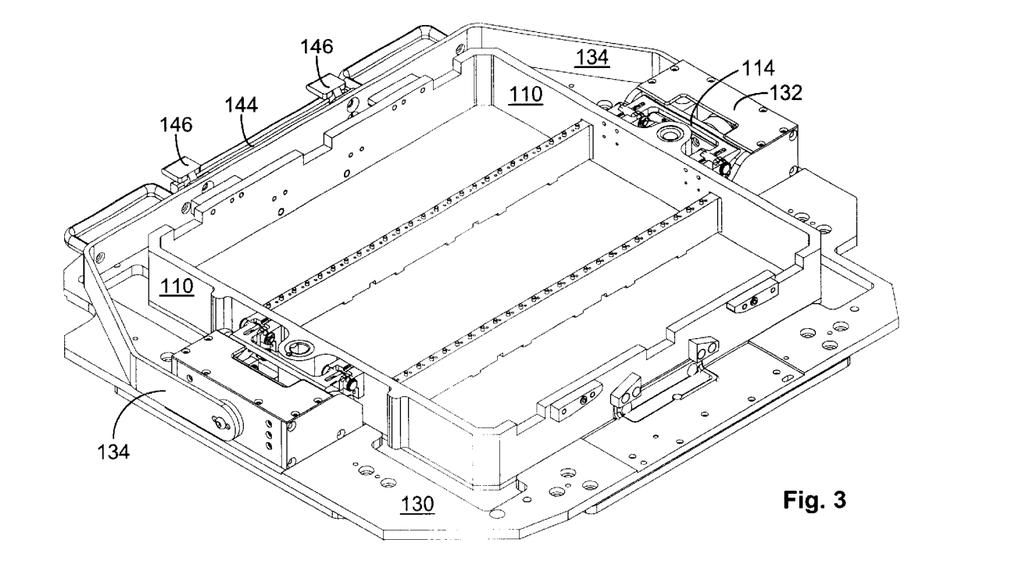
FIG. 3 is an isometric view showing the DIB both latched to the receiving plate and pulled down.

FIGS. 1–3 depict a sequence for attaching a DIB 100 to a peripheral in accordance with the invention. FIG. 1 shows a DIB 100 aligned with but not yet latched with a receiving plate 126. FIG. 2 shows the DIB 100 latched to the receiving plate 126 but not yet pulled down. FIG. 3 shows the DIB 100 both latched to the receiving plate 126 and pulled down. The receiving plate 126 is preferably mounted to an external surface of a peripheral (not shown), such as a prober or handler, in a region where the peripheral is designed to communicate electrical signals with a test head.

Beginning with FIG. 1, the DIB 100 includes a printed circuit board 112 attached to a substantially rectangular stiffener 110. Modules 122 receive connectors (not shown) for conveying electrical signals between the printed circuit board 112 and the test head, when the test head is docked with the peripheral. Once the DIB is attached to the receiving plate 126 and pulled down, the test head (not shown) can dock with the peripheral from above (from the perspective of FIG. 1), sandwiching the DIB 100 between the test head and the receiving plate 126.

Handles 114 are preferably attached to the stiffener 110 via devises 116. The handles perform three different roles. First, they allow an operator to conveniently carry the DIB and place it on the receiving plate 126. Second, they include mating members (see 1018 of FIG. 10B) for latching the DIB to the receiving plate 126. Third, the mating members act as anchors for allowing the DIB to be pulled down toward the receiving plate 126 with significant force. The handles are described in more detail with respect to FIGS. 10A and 10B.

The receiving plate 126 includes a base 130. Alignment pins 136 extend from the base 130 for entering bushings 120 on the DIB and establishing alignment between the DIB 100 and the peripheral. The positions of the pins and bushings could alternatively be exchanged. First and second pulldown mechanisms 132 are attached at opposing locations on the base 130. The pulldown mechanisms include connecting members 138 for engaging the mating members of the handles 114. They also include rotating members (see FIGS. 5, 7, 8, and 9). Rotation of the rotating members causes the connecting members 138 to move vertically.

A substantially U-shaped actuator 134 extends from the rotating member of the first pulldown mechanism 132 to the rotating member of the second pulldown mechanism 132, along a path that provides clearance for the DIB 100 when the DIB 100 is attached. Swinging the U-shaped actuator 134 through an arc rotates the rotating members of the pulldown mechanisms 132, thus causing the connecting members 138 to move vertically.

Turning to FIG. 2, the DIB 100 is shown latched to the receiving plate 126. The alignment pins 136 have been made to enter the bushings 120, and the mating members 1018 of the handles 114 have engaged the connecting members 138 of the pulldown mechanisms 132. As will become clear with reference to FIGS. 10A and 10B, the operator can cause the mating members 1018 of the handles 114 to engage the connecting members 138 by rotating the handles 114 upwardly as the DIB 100 is pressed against the receiving plate 126. Allowing the handles to spring downwardly with the DIB in place locks the connecting members and mating members together. Owing to the angled shape of the mating members 1018, pressing the DIB 100 toward the receiving plate 126 after it is aligned will rotate the handles even if the operator does not deliberately pull on them. Thus, simply applying a downward force locks the DIB in place. At this point, the DIB is firmly attached to the plate. The DIB 100 will not fall off even if the peripheral is face down.

Turning now to FIG. 3, the U-shaped actuator 134 includes two handles 140 that allow an operator to conveniently swing the actuator 134 from a first position (shown in FIGS. 1 and 2) to a second position (shown in FIG. 3). Swinging the actuator from the first position to the second position pulls down the connecting members 138 and therefore pulls down the DIB 100. The U-shaped actuator 134 includes latching members 142. These latching members are positioned and arranged for engaging latching members 144 attached to the base 130. With the actuator 134 in the second position, the operator presses down on the actuator to engage the latches 142 and 144. The actuator 134 will then stay in place even if the peripheral is face down.

Swinging the U-shaped actuator 134 imparts significant mechanical leverage for pulling down the DIB and compressing any spring loaded pins between the DIB and the peripheral. If the U-shaped actuator 134 is taken to be a semicircle having radius R, and swinging the actuator 134 through 180-degrees pulls down the DIB by a distance D, then the pull-down force will approximately equal the force exerted by the operator times $\pi R/D$. Thus, for example, swinging the actuator 1-meter to pull down the DIB 1-centimeter multiplies the operator's force by approximately 314. Literally thousands of pins can be compressed by applying only a few Newtons of force.

With the DIB 100 pulled down to the position shown in FIG. 3, the peripheral can be docked with a test head for testing devices. When it next becomes necessary to remove the DIB 100 from the peripheral 100, the operator can unlatch the U-shaped actuator 134 from the base 130 and the swing the actuator back to the first position. The latching member 144 on the base 130 is preferably spring loaded. Pressing on a portion 146 of the latching member 144 releases the latch and allows the U-shaped actuator 134 to be swung free of the base 130. The operator can then remove the DIB by pulling on the handles 114. Pulling the handles 114 first rotates the mating members 1018 out from around the connecting members 138 and then disengages the DIB from the receiving plate 126 altogether. The DIB can then be removed or replaced as desired.

Figure 4:
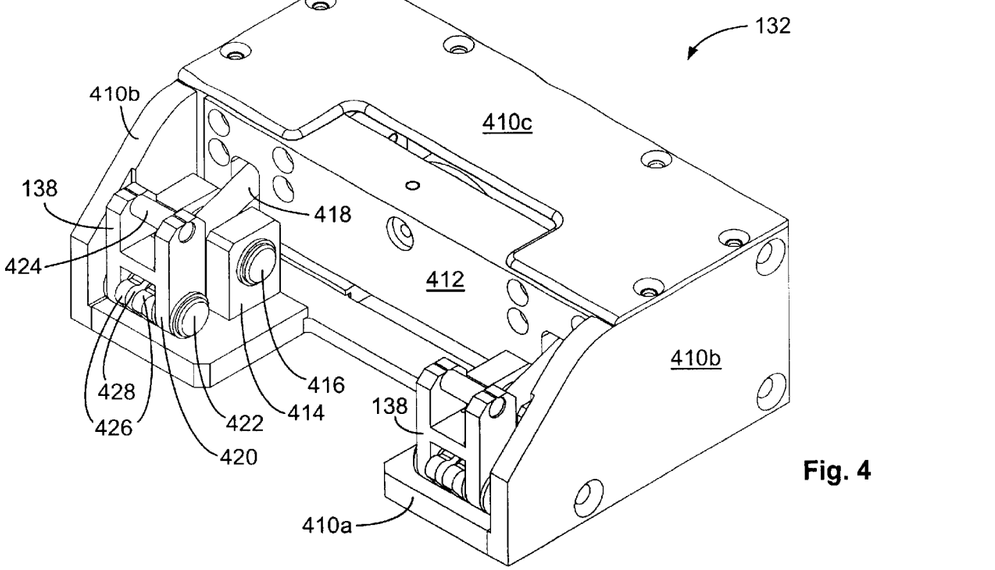
FIG. 4 is a substantially complete, front, isometric view of a pulldown mechanism attached to the receiving base of FIGS. 1–3.

FIGS. 4–8 show different views of the pulldown mechanism 132. As shown in FIG. 4, the pulldown mechanism 132 includes a bottom support 410a, side supports 410b, a top support 410c, and a back support 410d. The bottom support 410a and back support 410d are preferably continuous and made from a single piece of material, preferably aluminum. Alternatively, they can be provided as separate pieces. The pulldown mechanism 132 includes a cross member 412 mechanically coupled to the connecting members 138.

Figure 5:
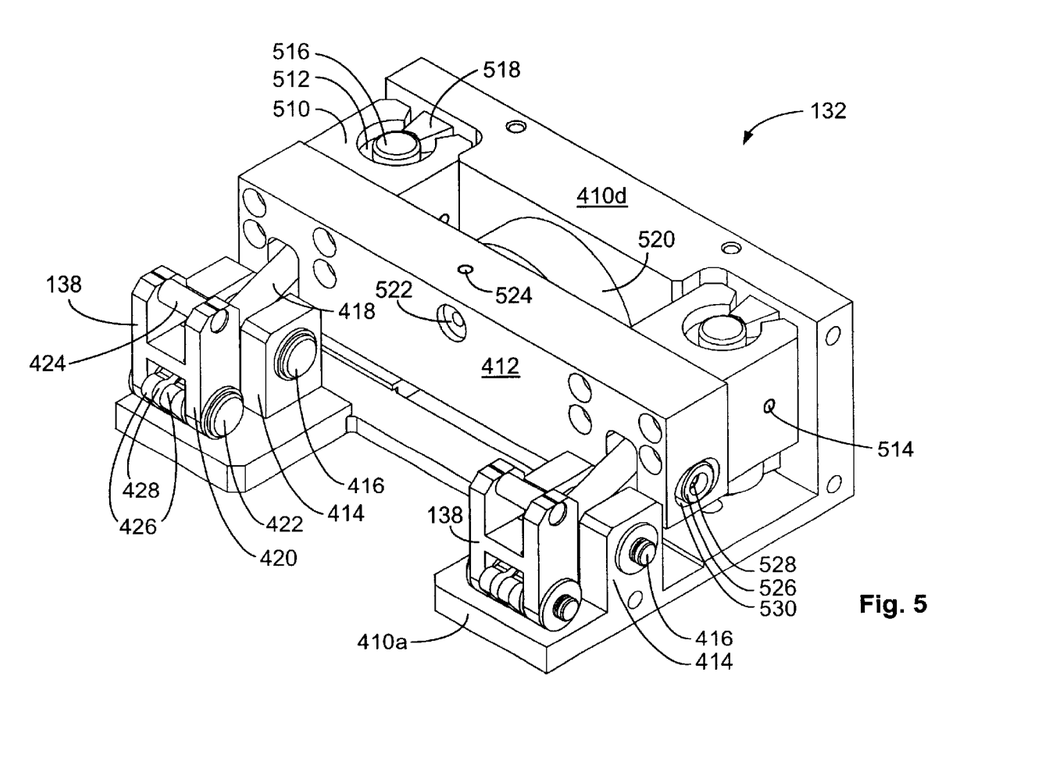
FIG. 5 is a front, isometric view of the pulldown mechanism of FIG. 4 with its top and side supports removed.
Figure 6:
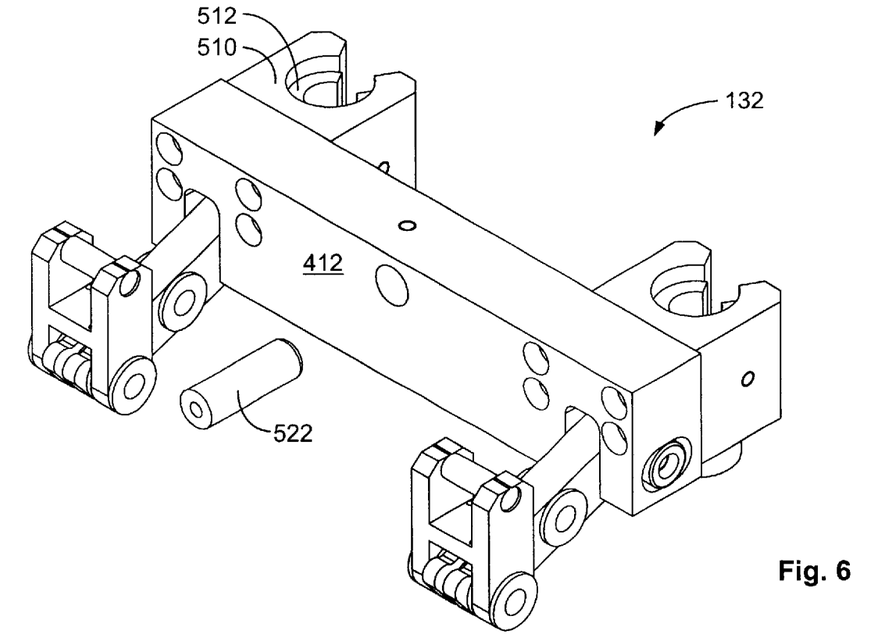
FIGS. 6 and 7 are front, isometric views showing partially disassembled portions of the pulldown mechanism of FIGS. 4 and 5.

The cross member 412 is fixedly attached to a pair of sliders 510 (see FIG. 5). The cross member 412 and sliders 510 are vertically movable on posts 516. The posts 516 are held away from the back support 410d by spacers 518. Plastic tubular bushings 512 are preferably disposed between the sliders 510 and posts 516 for providing smooth vertical movement. The bushings 512 are preferably held fixed with respect to the sliders 510 via setscrews inserted through threaded holes 514.

The cross member 412 is mechanically coupled to the connecting members 138 via linkage arms 418. A linkage arm 418 extends from each end of the cross member 412. At one end of each linkage arm 418, the linkage arm is rotatably attached to an end of the cross member 412 via a pin 528. At the other end, each linkage arm 418 is coupled to a connecting member 138. The pin is preferably retained within two holes 530 in the cross member 412 on either side of the linkage arm 418. The holes 530 are preferably horizontally elongated to allow the pin to move forward and back as the cross member 412 moves up and down. To reduce friction, the each pin 528 preferably makes contact with the inner walls of the holes 530 via a pair of roller bearings 526.

Pairs of tabs 414 extend upwardly from the bottom support 410a for capturing linkage arms 418 along its length, for example, at their midpoint. Pins 416 pass through holes in the tabs 414 and through a hole in the linkage arm 418. Each pin 416 acts as a fulcrum, inverting the direction of vertical movement of the linkage arm 418. As the cross member 412 is pushed up, the linkage arm 418 rotates about the pin 416, and the connecting member 138 is pulled down.

The connecting members 138 transmit the pulldown force to the DIB. Each connecting member 138 includes a substantially H-shaped link 420 rotatably coupled to a respective linkage arm 418 via a pin 422. At the end of the linkage arm 418, where it connects to the H-shaped link 420, the linkage arm includes a slot 428. A torsion spring (not shown) is disposed within the slot surrounding the pin 422 for applying a force to the H-shaped link 420 to bias it in its vertical position. The torsion spring is similar to the spring 1010 of FIGS. 10A and 10B. The end of the linkage arm 418 also includes nubs 426. The nubs limit the downward rotation of the link 420 to ensure that they always point substantially upwardly. A pin 424 extends across the top of each H-shaped link 420 for directly engaging the mating member 1018 of the DIB handle 114. The pin 424 is preferably welded in place. Preferably, two connecting members 138 are provided on each pulldown mechanism 132. The two connecting members are spaced apart and activate simultaneously to keep the DIB substantially level as it pulls down.

Figure 7:
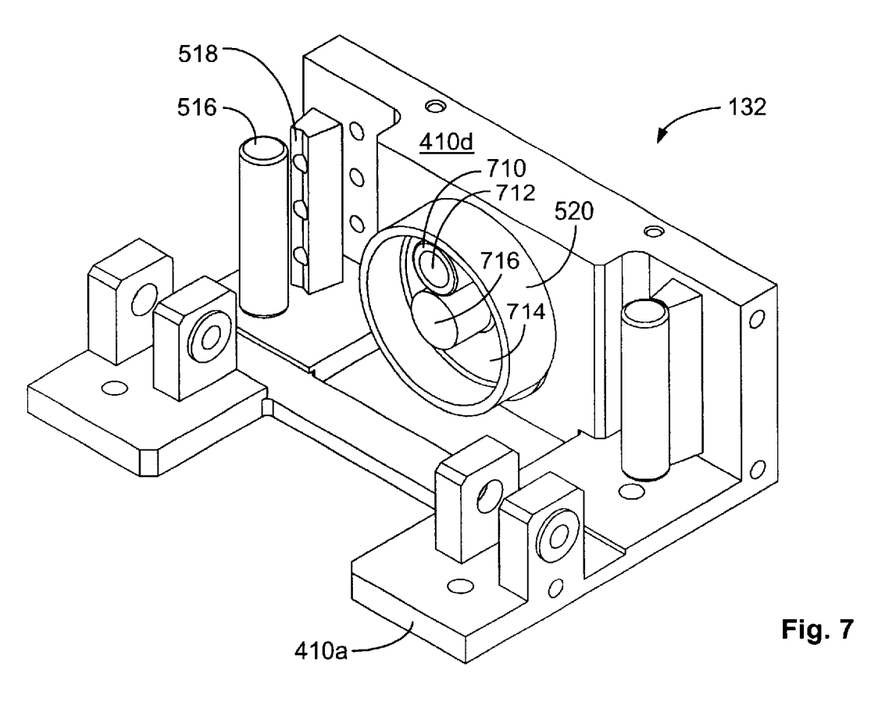
Figure 8:
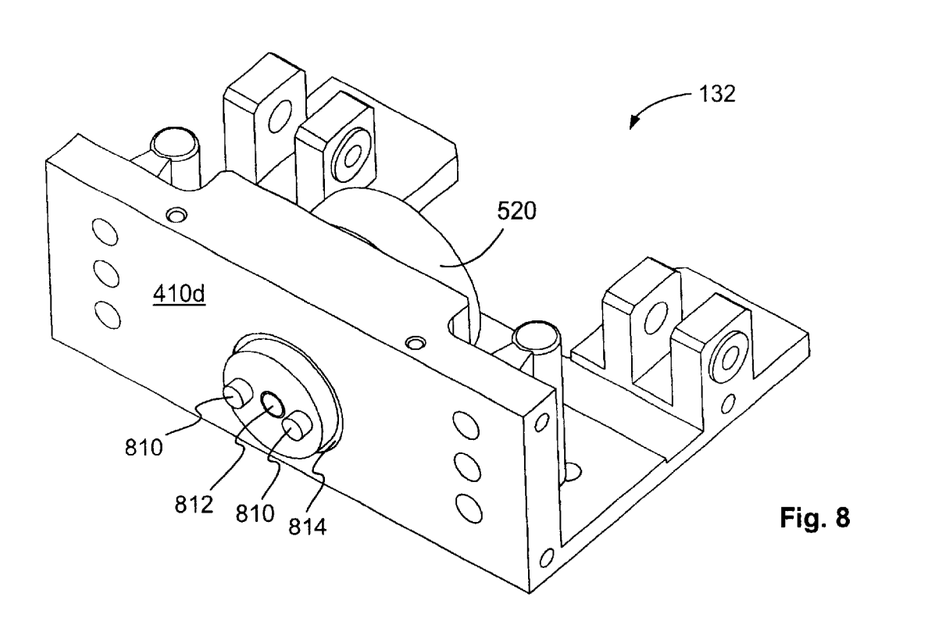
FIG. 8 is a rear, isometric rear view of a partially disassembled portion of the pulldown mechanism of FIGS. 4–7.
Figure 9A:
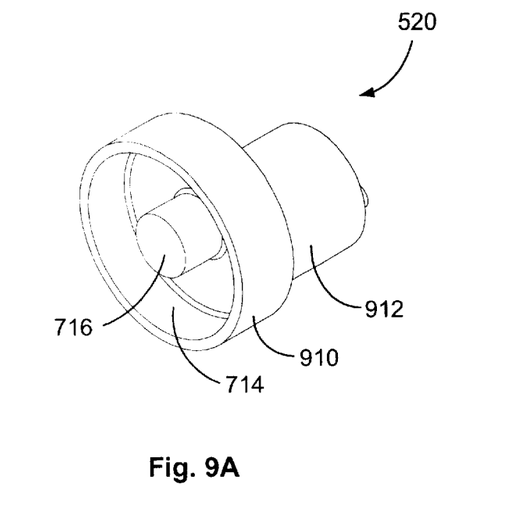
FIGS. 9A and 9B are front and rear isometric views of a cam used in the pulldown mechanism of FIGS. 4–8.
Figure 9B:
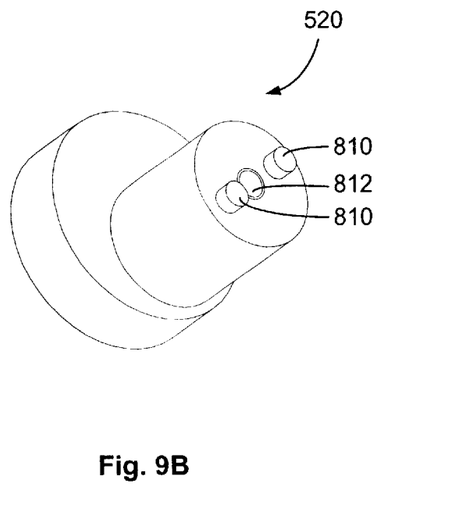

FIGS. 7–9 show the rotational components of the pulldown mechanism 132. A cam 520 includes a front portion 910 and a rear portion 912 (see FIG. 9A). The front portion 910 is disposed within the pulldown mechanism 132 and includes a hollow channel 714, for receiving a cam follower, and a central hub 716. The rear portion 912 of the cam 520 extends through a hole 814 in the rear support 410d.

Referring to FIG. 8, the rear portion 912 includes dowel pins 810 that are preferably press fit into holes in the rear portion 912 of the cam 520. It also includes a threaded hole 812 for receiving a screw. When the system is assembled, the rear portion 912 of the cam 520 is attached to one end of the U-shaped actuator 134. The end of the U-shaped actuator has three holes. Two of the holes receive the dowel pins 810 and one receives the screw. The screw passes through a hole in the end of the U-shaped actuator and is threaded into the hole 812. This arrangement of dowel pins and holes allows the U-shaped actuator to apply significant torque to the rear portion 912 of the cam 510.

Within the pulldown mechanism 132, the front portion 910 of the cam is disposed against the rear of the cross member 412 (see FIG. 5). A pin 522, acting as a cam follower, passes through a hole in the cross member 412 and into the channel 714 of the cam 520. The pin 522 is preferably locked in place within the cross member 412 via a setscrew inserted through a threaded hole 524. Preferably, a roller bearing 710 is disposed within the channel 714 for reducing friction between the pin 522 and the inner surfaces of the channel 714. The roller bearing has a hole 712 into which the pin 522 is engaged.

Rotating the cam 520 causes the cross member 412 to move vertically. As the U-shaped actuator of the completed assembly swings from the first position to the second position, the rear portion 912 of the cam 520 rotates as well. The front portion 910 of the cam 920 both rotates and describes a circular path. The front and rear portions 910 and 912 of the cam 520 are not coaxial, but rather have offset axes. The offset allows the pin 522 to maintain a fixed horizontal position within the cross member 412 while the cam is being rotated. The cam 520 is preferably a closed, or "desmodronic" cam. It exerts force on the pin 522 for both clockwise and counterclockwise directions of rotation. Using a desmodronic cam, swinging the U-shaped actuator in both directions actively drives the connecting members 138 both up and down. Alternatively, an open cam could be used, which only actively pulls the connecting members down. Spring forces from pogo pins, or springs added to the pulldown modules, could then be used to restore the connecting members to their upper positions.

Figure 10A:
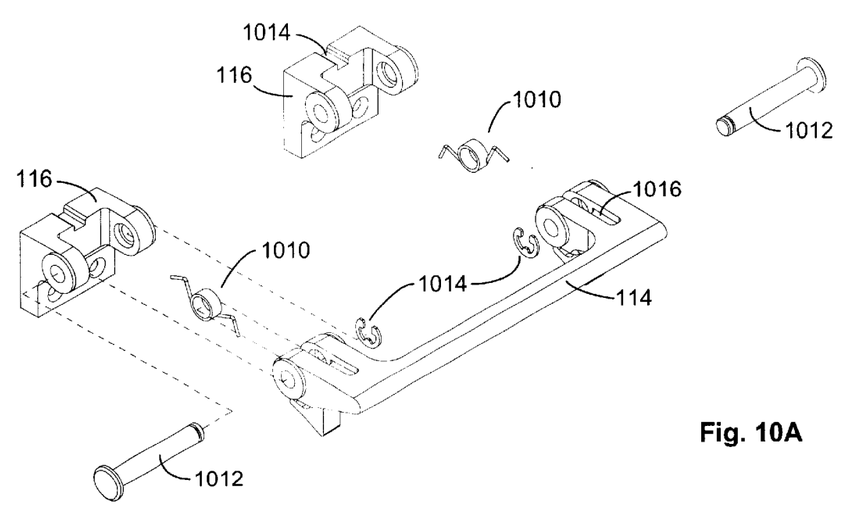
FIGS. 10A–10B are upper and lower exploded, isometric views of the latching handle attached to the DIB for latching to the pulldown mechanisms of FIGS. 4–9.
Figure 10B:
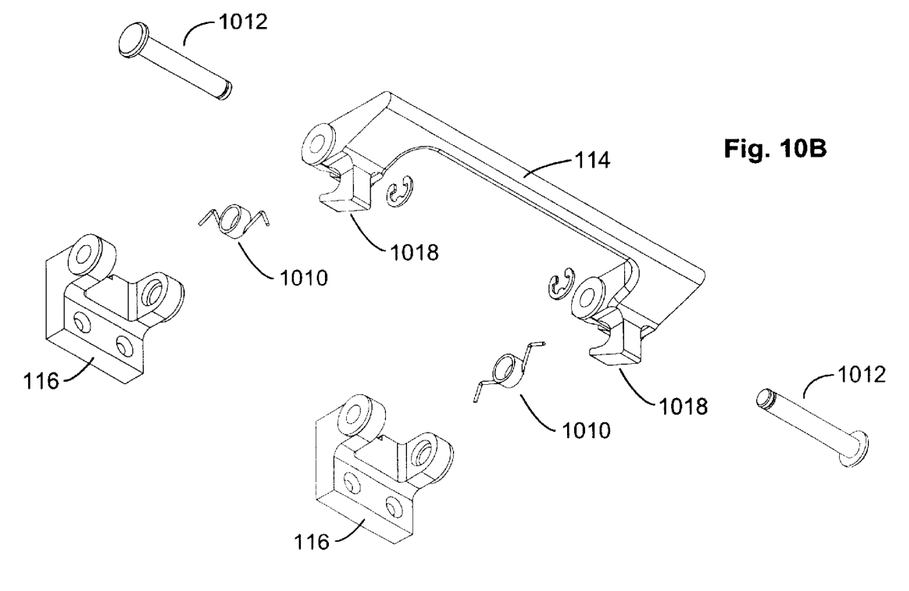

FIGS. 10A and 10B illustrate the structural details of the DIB handles 114. As shown in FIGS. 10A and 10B, each handle 114 includes a clevis pin 1012 that holds the handle 114 in place, and allows the handle to be rotated upwardly and downwardly. A slot is preferably formed within each end of the handle for receiving a torsion spring 1010. Each of the clevis pins 1012 passes through a clevis 116, through one side of the handle 114, and through the center of a torsion spring 1010. The clevis pins are retained by E-clips 1014. The torsion springs 1010 have ends that rest within indents 1014 and 1016. The torsion springs 1010 exert a force on the handle 114 with respect to the devises that tends to restore the handle to a downward position. As shown in FIG. 10B, the lower portion of each handle includes mating members 1018. By rotating the handle 114 about the clevis pins 1012, the position of the mating members 1018 with respect to the DIB can be changed.

Materials used to construct the pulldown mechanism 132 can be varied widely within the scope of the invention. Nevertheless, in the preferred embodiment, the outer supports 410*a–d* and standoffs 518 are aluminum. The posts 516 are preferably hardened aluminum. The cross member 412, linkage arm 418, and connecting members 138 are steel. Nylon bushings or bushings made from other types of plastic are used within holes that support rotation, or roller bearings are used, as indicated, where there is a need to minimize friction.

The instant invention provides numerous advantages over the prior techniques and mechanisms for attaching a DIB. First, DIBs can be attached quickly and conveniently, simply by aligning the DIB 100 with the receiving plate 126, pressing it in place, and swinging the U-shaped actuator 134. Because pressing the DIB against the receiving plate latches the DIB in place, the DIB can be installed quickly and conveniently, even when the receiving plate is face down. Because very little force is required of the operator when pulling down the DIB, the technique is well suited for use with probers, where pulling down the DIB involves compressing large numbers of spring-loaded pins. Because the receiving plate maintains precise alignment with the DIB, the technique is also well suited for use with handlers, which impose tight tolerances on the positions of their sockets. The technique can thus be used with both probers and handlers, and eliminates the need for maintaining separate hardware and procedures.

The technique of the instant invention provides other benefits as well. Because the U-shaped actuator actuates both pulldown mechanisms simultaneously, the technique ensures that the DIB pulls down uniformly. Uniform pull down prevents alignment pins 136 from binding within their bushings 120. When the technique is used with a prober, uniform pull down also prevents spring-loaded pins of the probe tower from laterally "scrubbing" against the contacts with which the pins mate, as the DIB is pulling down. The mechanism of the instant invention is also compact. The pulldown mechanisms 132 themselves occupy little space in relation to the DIB, and the U-shaped actuator 134 preferably conforms tightly to one side or the other of the DIB, and thus occupies little space as well.

Alternatives

Having described one embodiment, numerous alternative embodiments or variations can be made. For instance, as described above, the receiving plate 126 is fastened to the peripheral. Alternatively, the receiving plate 126 can be attached to the test head. This arrangement is well suited for use with probers, which do not require exceedingly tight tolerances in their alignment. It is less advantageous with handlers. If the plate is mounted to the test head and is intended for use with both probers and handlers, separate provisions will be needed for handlers to ensure the requisite alignment.

As used herein, the term "DIB" refers to an assembly placed between a test head and a peripheral. However, it can more generally be regarded as any assembly that is sandwiched between two separable portions of a testing system that are docked together to perform testing. Also, as shown and described herein, the DIB is a rectangular assembly. However, this is merely an example. DIBs can be rectangular, circular, or assume a wide range of other shapes.

As shown and described herein, the pulldown mechanisms 132 are separate assemblies mounted to the surface of the base 130. Alternatively, using techniques known to those skilled in the art, the pulldown mechanisms 132 can be recessed within the base 130, or can be partially formed within the base.

The exemplary embodiment described herein includes two pulldown mechanisms 132. However, additional pulldown mechanisms can be used. These mechanisms can be linked together, using techniques known to those skilled in the art, to ensure that they activate simultaneously.

As described above, the cross members 142 are preferably steel. Alternatively, they could be made of a more flexible material. Because printed circuit boards can be made with different thickness, the cross member 142 can be made to bow when pulling down DIBs for thicker boards, if it is made of a flexible material. Thus, the overall system could be made to easily accommodate a wide range of board thickness.

The pulldown mechanisms 132 are shown and described as having two connecting members 138. However, this number could be varied depending upon the particular requirements of the application.

As described herein, the pulldown mechanisms 132 preferably use cams. Alternatively, the pulldown mechanisms 132 could use gears, for example, rack and pinion gears. Alternatively, other mechanism for transforming rotation into vertical translation could be used.

As shown and described, the DIB handles 114 are provided with mating members 1018 for engaging pins 424 on the connecting members 138. Alternatively, the positions of the mating members and engaging pins could be reversed, or other types of latching mechanisms could be used.

As described herein, the pulldown mechanisms 132 are fastened to the base 130 and the mating members are attached to the DIB. Alternatively, the pulldown mechanisms could be attached to the DIB with mating mechanism attached to the base. This arrangement is less economical than the preferred embodiment, however, because test systems generally support large numbers of DIBs. It is therefore less costly to provide the pulldown mechanisms 132 on the base 130, where they can be shared among different DIBs.

As shown and described, the DIB handles 114 perform three different functions: handle, latch, and anchor. Alternatively, these functions could be provided using separate hardware.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. A mechanism for attaching a DIB to a surface of a test head or peripheral, comprising:

first and second pulldown mechanisms, each attached to the surface and including a rotating member coupled to at least one connecting member for attaching to the DIB, wherein a rotation of the rotating member induces a vertical movement of the at least one connecting member; and a substantially U-shaped actuator having first and second ends coupled to the rotating members of the first and second pulldown mechanisms, wherein a movement of the U-shaped actuator through an arc rotates the rotating members of the first and second pulldown mechanisms, thereby causing the connecting members to move vertically.

2. A mechanism as recited in claim 1, wherein the first and second pulldown mechanisms are attached to a base and are spaced apart for engaging opposing portions of a DIB.

3. A mechanism as recited in claim 2, wherein the base has a central axis about which the first and second pulldown mechanisms are symmetrically disposed.

4. A mechanism as recited in claim 3, wherein the at least one connecting member of each of the first and second pulldown mechanisms comprises two connecting members spaced apart along an axis substantially parallel to the central axis.

5. A mechanism as recited in claim 3, wherein
   the U-shaped actuator is attached to each of the rotating members at a relatively distal portion of the pulldown mechanism relative at least one connecting member from the perspective of the central axis.

6. A mechanism as recited in claim 3, wherein the U-shaped actuator has two operative positions, a first position disposed substantially against a first side of the base and being indicative of a pulled down condition, and a second position disposed substantially against a second side of the base and being indicative of a non-pulled down condition.

7. A mechanism as recited in claim 6, wherein a movement of the U-shaped actuator between the first and second positions with a DIB attached causes the U-shaped actuator to describe an arc that extends over the DIB without interfering with the DIB.

8. A mechanism as recited in claim 6, further comprising a first latching member coupled to the U-shaped actuator and a second latching member coupled to the base, wherein swinging the U-shaped actuator to the first position causes the first latching member to engage the second latching member to hold the U-shaped actuator in place relative to the base.

9. A mechanism as recited in claim 8, wherein one of the first and second latching members includes a movable portion, a movement of which unlatches the first and second latching members to release the U-shaped actuator from its position relative to the base.

10. A mechanism as recited in claim 6, wherein the U-shaped actuator includes at least one handle extending from the U-shaped actuator.

11. A mechanism as recited in claim 3, wherein the at least one connecting member is constructed and arranged for latching with a corresponding mating member on the DIB.

12. A mechanism as recited in claim 11, further comprising at least one of an alignment pin and an alignment bushing on the base for establishing alignment with a DIB.

13. A mechanism as recited in claim 1, wherein the rotating member of each of the pulldown mechanisms comprises a cam.

14. A mechanism as recited in claim 13, wherein the cam is a desmodronic cam.

15. A mechanism as recited in claim 13, wherein the cam is coupled to a cam follower that is maintained within a cross member, the cross member moving vertically in response to rotation of the cam.

16. A mechanism as recited in claim 15, wherein the at least one connecting member includes two connecting members coupled to opposite ends of the cross member via inverting linkages.

17. A mechanism as recited in claim 1, wherein the rotating member of each of the pulldown mechanisms comprises a gear.

18. A mechanism for attaching a DIB to a surface of a tester or peripheral, comprising:

a base attached to the surface;

at least one of an alignment pin and an alignment bushing on the base for establishing physical alignment of the DIB relative to the base;

first and second pulldown mechanisms, each coupled to the base and including a rotating member coupled to at least one connecting member via a translation mechanism, the translation mechanism converting rotation of the rotating member into vertical movement of the at least one connecting member; and a substantially U-shaped actuator having first and second portions coupled to the rotating members of the first and second pulldown mechanisms, wherein a movement of the U-shaped actuator through an arc rotates the rotating members of the first and second pulldown mechanisms and imparts mechanical leverage for pulling down the DIB.

19. A method for attaching a DIB to a surface of a tester or peripheral, comprising:

applying the DIB to the surface in alignment to latch a plurality of mating members on the DIB with a plurality of complimentarily disposed connecting members coupled to the surface; and swinging a substantially U-shaped actuator from a first position on one side of the DIB to a second position on another side of the DIB to cause the connecting members to pull the DIB against the surface.

20. A method for testing electronic devices using a tester and a peripheral, comprising:

applying a DIB to a surface of one of the tester and peripheral in alignment to latch a plurality of mating members on the DIB with a plurality of complimentarily disposed connecting members coupled to the surface;

swinging a substantially U-shaped actuator from a first position on one side of the DIB to a second position on another side of the DIB to cause the connecting members to pull the DIB against the surface;

docking the test head with the peripheral with the DIB disposed between the tester and the peripheral; and conveying electrical signals between the tester and devices under test to determine whether the devices operate properly.

* * * * *